United States Patent
Lee et al.

(10) Patent No.: US 10,043,807 B1
(45) Date of Patent: Aug. 7, 2018

(54) SEMICONDUCTOR DEVICE AND METHOD OF FORMING THE SAME

(71) Applicant: UNITED MICROELECTRONICS CORP., Hsin-Chu (TW)

(72) Inventors: Rung-Yuan Lee, New Taipei (TW); Yu-Cheng Tung, Kaoshiung (TW); Chun-Tsen Lu, Tainan (TW); En-Chiuan Liou, Tainan (TW); Kuan-Hung Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/641,236

(22) Filed: Jul. 4, 2017

(30) Foreign Application Priority Data

May 24, 2017 (TW) .............................. 106117128 A

(51) Int. Cl.

| | | |
|---|---|---|
| *H01L 21/00* | (2006.01) | |
| *H01L 27/00* | (2006.01) | |
| *H01L 29/00* | (2006.01) | |
| *H01L 27/092* | (2006.01) | |
| *H01L 27/02* | (2006.01) | |
| *H01L 29/08* | (2006.01) | |
| *H01L 29/78* | (2006.01) | |
| *H01L 21/8238* | (2006.01) | |
| *H01L 29/66* | (2006.01) | |
| *H01L 21/8234* | (2006.01) | |
| *H01L 21/02* | (2006.01) | |

(52) U.S. Cl.
CPC .... *H01L 27/0924* (2013.01); *H01L 21/02636* (2013.01); *H01L 21/823418* (2013.01); *H01L 21/823821* (2013.01); *H01L 21/823828* (2013.01); *H01L 27/0207* (2013.01); *H01L 29/0847* (2013.01); *H01L 29/6653* (2013.01); *H01L 29/7843* (2013.01)

(58) Field of Classification Search
CPC ....... H01L 21/02636; H01L 21/823418; H01L 21/823821; H01L 21/823828; H01L 27/0924; H01L 27/0207; H01L 27/0886; H01L 29/0847; H01L 29/6653; H01L 29/7843
See application file for complete search history.

(56) References Cited

U.S. PATENT DOCUMENTS

| | | | |
|---|---|---|---|
| 7,659,157 B2 * | 2/2010 | Greene | ........... H01L 21/823807 257/E21.242 |
| 8,809,139 B2 * | 8/2014 | Huang | ............ H01L 21/823807 257/E21.176 |
| 8,981,481 B2 * | 3/2015 | Hafez | ............... H01L 29/66545 257/329 |
| 9,331,074 B1 | 5/2016 | Chang et al. | |
| 9,508,727 B2 | 11/2016 | Park et al. | |

(Continued)

*Primary Examiner* — Nikolay Yushin
(74) *Attorney, Agent, or Firm* — Winston Hsu

(57) ABSTRACT

A semiconductor device and a method of forming the same, the semiconductor device includes a plural fin structures, two gates, a protection layer and an interlayer dielectric layer. The fin structures are disposed on a substrate. The two gates are disposed on the substrate across the fin structures. The protection layer is disposed on the substrate, surrounded sidewalls of the two gates. The interlayer dielectric layer is disposed on the substrate, covering the fin structures and the two gates.

19 Claims, 6 Drawing Sheets

(56) References Cited

U.S. PATENT DOCUMENTS

| | | | |
|---|---|---|---|
| 2009/0078997 A1* | 3/2009 | Greene | H01L 21/823807 257/347 |
| 2014/0001569 A1* | 1/2014 | Hafez | H01L 29/66545 257/392 |
| 2014/0145242 A1* | 5/2014 | Huang | H01L 21/823807 257/192 |
| 2017/0084461 A1 | 3/2017 | Colinge et al. | |
| 2017/0084714 A1 | 3/2017 | Ching et al. | |

* cited by examiner

SEMICONDUCTOR DEVICE AND METHOD OF FORMING THE SAME

BACKGROUND OF THE INVENTION

1. Field of the Invention

The present invention relates to a semiconductor device and a forming method thereof, and more particularly to a semiconductor device having a stress layer and a forming method thereof.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non planar FETs, such as the fin field effect transistor (FinFET) have three-dimensional structure, not only capable of increasing the contact to the gate but also improving the controlling of the channel region, such that the non planar FETs have replaced the planar FETs and become the mainstream of the development.

For the sake of increasing the carrier mobility of the semiconductor structure, a compressive stress or tensile stress can be optionally applied to the gate channel. In conventional arts, a selective epitaxial growth (SEG) process is used to form an epitaxial layer for creating proper stress. While the foregoing method can improve the carrier mobility in the channel region, said method also has led to the difficulty of the overall fabrication process and the process control, especially under the trend of miniaturization of semiconductor device dimensions. Thus, it is easy to cause some drawbacks, such as damages to the light doped drain (LDD) region leading to short channel effect, resulting in increased leakage current. Hence, there is a need of proving a novel fabrication method of the FinFET device, to obtain more reliable semiconductor device.

SUMMARY OF THE INVENTION

It is one of the primary objectives of the present invention to provide a semiconductor device, in which a stress layer is disposed to surrounded two gates simultaneously, so as to gain preferable element performance and better reliability.

It is one of the primary objectives of the present invention to provide a method of forming a semiconductor device. Through forming a stress layer simultaneously surrounded two gates, a semiconductor with preferable performance and better reliability is obtained.

To achieve the purpose described above, the present invention provides a semiconductor device including a plurality of fin structures, two gates, a spacing layer and a dielectric layer. The fin structures are disposed on a surface of a substrate, and the two gates are disposed on the substrate, across the fin structures. The two gates are disposed separately in a direction, with each of the two gates being extended along the direction, and a first end of one of the two gates faces a second end of another one of the two gates. The spacing layer is disposed on the substrate, with the spacing layer simultaneously surrounded sidewalls of the two gates and directly in contact with the first end and the second end of the two gates. The dielectric layer is disposed on the substrate, surrounded the spacing layer To achieve the purpose described above, the present invention provides a method of forming a semiconductor device which includes the following steps. First of all, a substrate is provided, and a plurality of fin structure is formed on a surface of the substrate. Next, two gates are formed across the fin structures, and the two gates are extended along a direction and disposed separately on the direction, wherein a first end of one of the two gates faces a second end of another one of the two gates. Then, a dielectric layer is formed on the substrate, covering the two gates and the fin structures. After forming the dielectric layer, a spacing layer is formed on the substrate, to simultaneously surround the two gates, and to directly contact the first end and the second end of the two gates.

Overall, the present invention provides an effective method of forming a semiconductor device, in which, a spacing layer is formed to simultaneously surround plural gates, and the spacing layer includes a dielectric material which may create a proper stress, such as a compressive stress nitride (SiN) or a tensile stress nitride. In this way, the spacing layer may be function like a compressive stress layer or a tensile stress layer, so as to create proper stress the channel regions below each the gates.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 are schematic diagrams illustrating a method of forming a semiconductor device according to a first embodiment of the present invention, in which:

FIG. 1 illustrates a three-dimensional view of a semiconductor device at the beginning of the forming process;

FIG. 2 illustrates a three-dimensional view of a semiconductor device after forming fin-cut process;

FIG. 3 illustrates a three-dimensional view of a semiconductor device after forming a spacer;

FIG. 4 illustrates a three-dimensional view of a semiconductor device after forming a sacrificial spacer;

FIG. 5 illustrates a three-dimensional view of a semiconductor device after forming source/drain regions;

FIG. 6 illustrates a three-dimensional view of a semiconductor device after forming a dielectric layer;

FIG. 7 illustrates a three-dimensional view of a semiconductor device after removing the sacrificial spacer;

FIG. 8 illustrates a three-dimensional view of a semiconductor device after forming a spacing layer.

DETAILED DESCRIPTION

To provide a better understanding of the presented invention, preferred embodiments will be described in detail. The preferred embodiments of the present invention are illustrated in the accompanying drawings with numbered elements.

Figure 1:
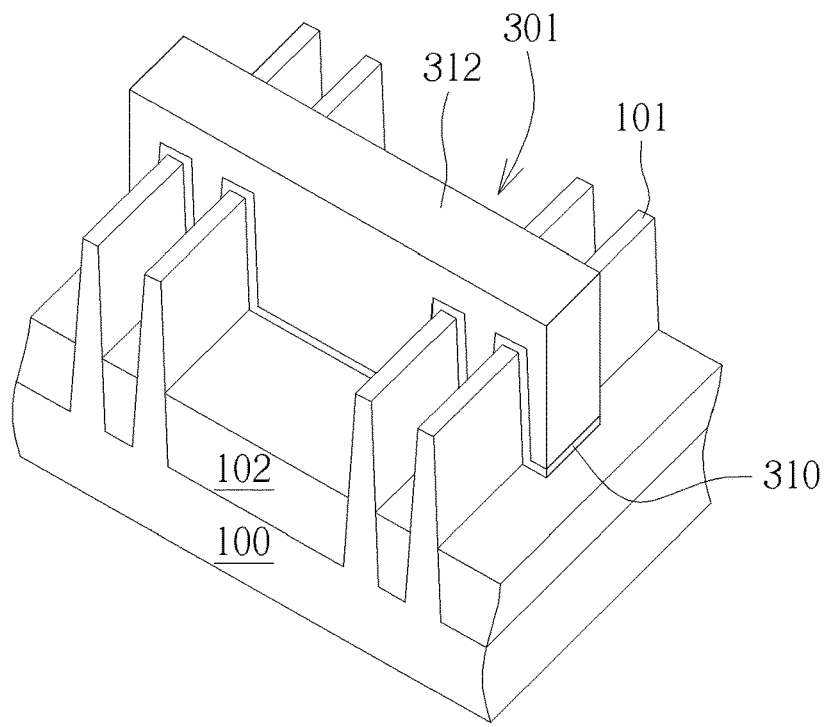

Please refer to FIG. 1 to FIG. 8, which are schematic diagrams illustrating a forming process of a semiconductor device according to the first embodiment of the present invention. First of all, as shown in FIG. 1, a substrate layer 100 such as semiconductor substrate like silicon substrate, silicon containing substrate or silicon-on-insulator (SOI) substrate, is provided and at least one fin structures 101 is formed on a surface of the substrate 100.

In the embodiment of the bulk silicon, the fin structure 101 is formed through a sidewall image transfer (SIT) process. The process may include forming a plurality of patterned sacrificial layers (not shown in the drawings) on a bulk silicon substrate not shown in the drawings) by using a photolithography and an etching process, performing a depositing and an etching processes sequentially to form a spacer (not shown in the drawings) at sidewalls of each of the patterned sacrificial layers, and then removing the patterned sacrificial layers and performing at least one etching process through the spacer. That is, a plurality of shallow trenches (not shown in the drawings) is formed in the bulk silicon substrate and the fin structures 101 are simultaneously defined on a surface of the substrate 100. Then, another depositing and an etching back processes are sequentially performed to form an insulating layer 102 in the shallow trenches, thereto form a shallow trench isolation (STI).

Alternatively, in another embodiment, the formation of the fin structures 101 may also be accomplished by first forming a patterned hard mask (not shown in the drawings) on the substrate 100, and then performing an epitaxial process on the exposed substrate 100 through the patterned hard mask to form a semiconductor layer (not shown in the drawings), such as silicon or silicon germanium (SiGe) layer, thereto used as the corresponding fin structures. Otherwise, in the embodiment of having an SOI substrate (not shown in the drawing), the aforementioned spacer may be used to etch a semiconductor layer (not shown in the drawings) on the substrate until reaching a bottom oxide layer (not shown in the drawing) underneath to form the corresponding fin structures.

Figure 2:
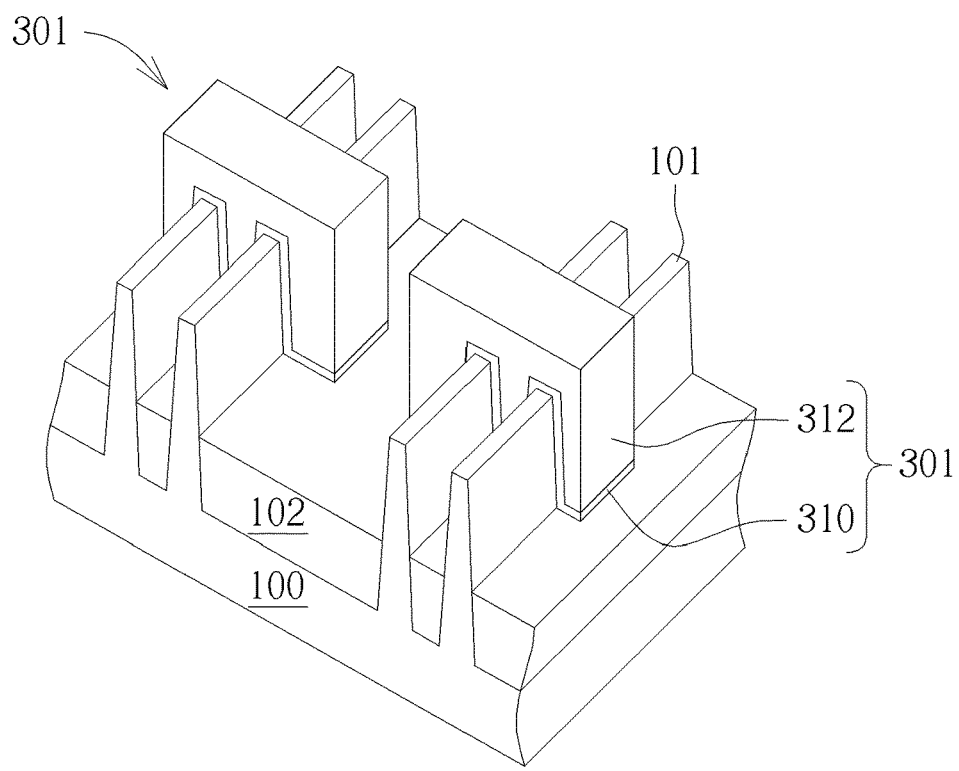
Figure 3:
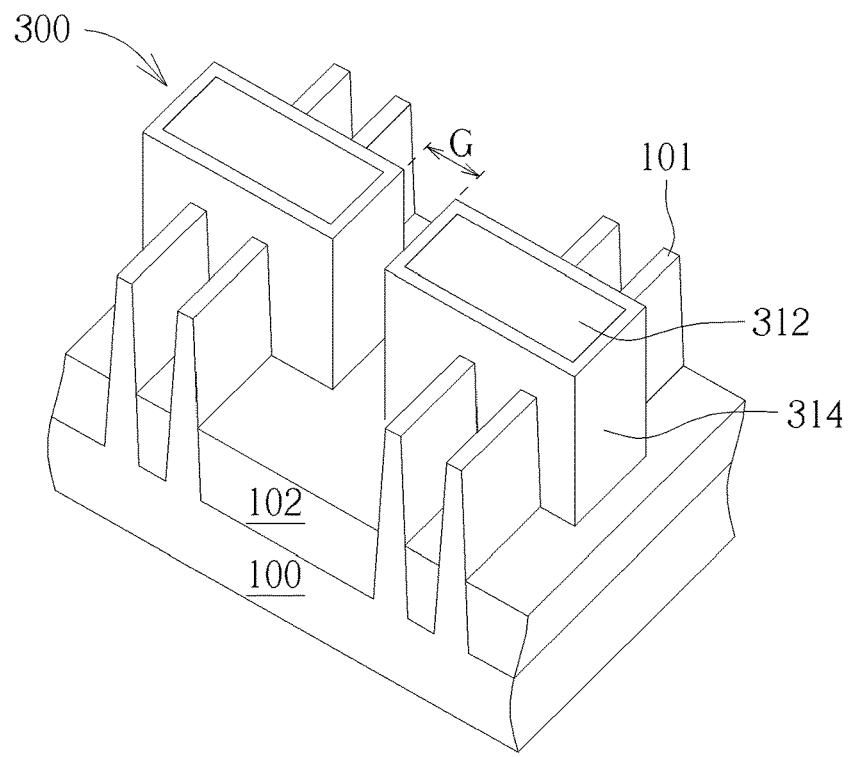

Next, two gates 300 are formed across the fin structures 101. In the present embodiment, each of the two gates 300 are preferably includes a polysilicon gate, and the formation thereof can be therefore integrated in a general gate process. For example, a gate dielectric layer (not shown in the drawings) for example including a dielectric material like silicon oxide, and a gate layer (not shown in the drawings) are formed on the fin structures 101, and the gate layer and the gate dielectric layer are patterned to form a gate stacked structure 301 shown in FIG. 1 which includes a gate dielectric layer 310 and a gate layer 312 stacked one over another. The gate stacked structure 301 is extended along a direction (not shown in the drawings), and the direction is preferably perpendicular to the extending direction of the fin structures 101, but is not limited thereto. The gate stacked structure 301 is further patterned to form two portions extended along the direction, with each of the two portions separated from each other and across a portion of the fin structures, as shown in FIG. 2. Then, a spacer material (not shown in the drawings) for example including silicon oxide (SiO) or silicon oxynitride (SiON) is formed to cover the substrate 100, fin structures 101 and the gate stacked structure 301, and an etching back process is performed to form a spacer 314 on sidewalls of each portion of the gate stacked structure 301 respectively, to surrounded each portion of the gate stacked structure 301 thereto. Through the aforementioned process, the two gates 300 extended along the direction are formed, and each of the two gates 300 crosses a portion of the fin structures 101 respectively, as shown in FIG. 3. The two gates 300 are separated disposed on the fin structure 101 along the direction, and a gap G is between the two gates 300. That is, one end (for example the short-side end) of one gate 300 faces another end (for example the short-side end) of another gate 300, and two ends are spaced by the gap G, as shown in FIG. 3.

However, it is known by people skilled in the arts the formation of the gates 300 is not limited thereto, and in another embodiment, a spacer (not shown in the drawings) may also be formed before the gate stacked structure is patterned, with the spacer surrounded the entire gate stacked structure, and patterning the gate stacked structure 301 and the spacer, to form two separated gates (not shown in the drawings). In this way, one end (for example the short-side end) of each of the two gates is not surrounded by the spacer, and the spacer is therefore to perform like a U-shape (not shown in the drawings).

Figure 4:
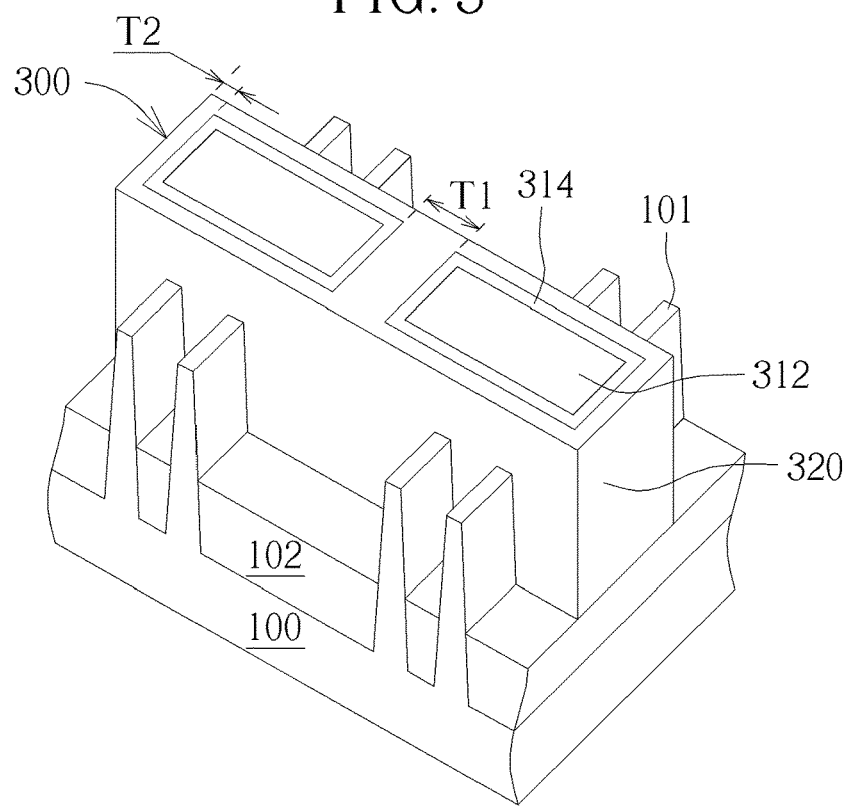

Moreover, a sacrificial spacer 320 is formed. Precisely, another spacer material (not shown in the drawings) for example including a dielectric material having etching selectivity related to the spacer 314, like silicon nitride (SiN) or silicon carbonitride (SiCN) is formed to cover the substrate 100, fin structures 101 and the two gates 300 the another spacer material. The another spacer material is allowable to cover entire sidewalls of each gate 300, including the two facing ends of the two gates 300, and to further fill up the gap G between the two gates 300. Thus, after performing an etching back process, the sacrificial spacer 320 may be formed on sidewalls of the two separate gates 300 and simultaneously surround the two separated gates 300, as shown in FIG. 4. It is noted that, the sacrificial spacer 320 filled in the gap G has a greater thickness T1, for example being about 3 times to 5 times greater than a thickness T2 of the sacrificial spacer 320 in rest portions.

Figure 5:
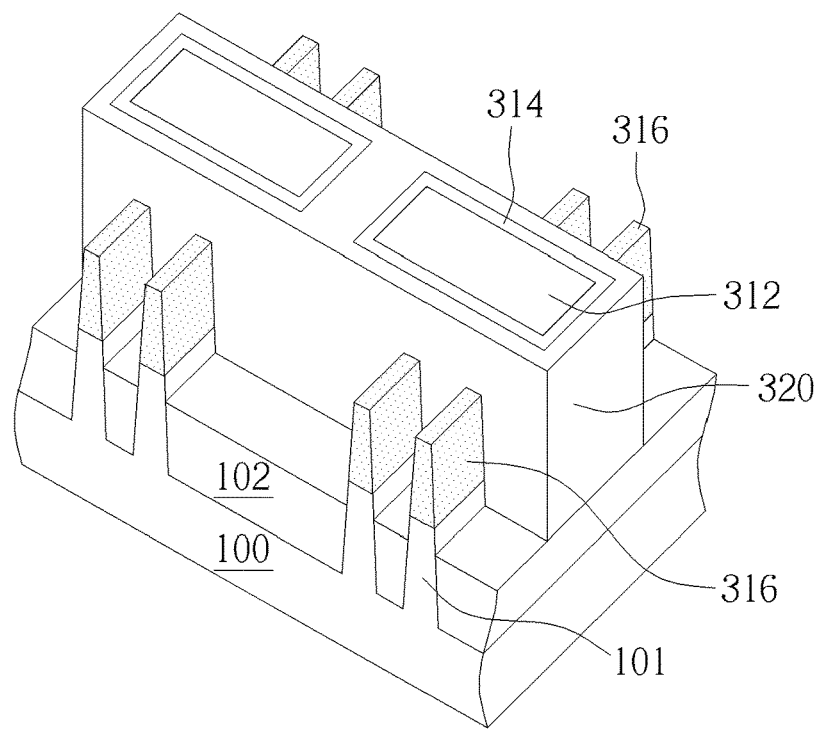
Figure 6:
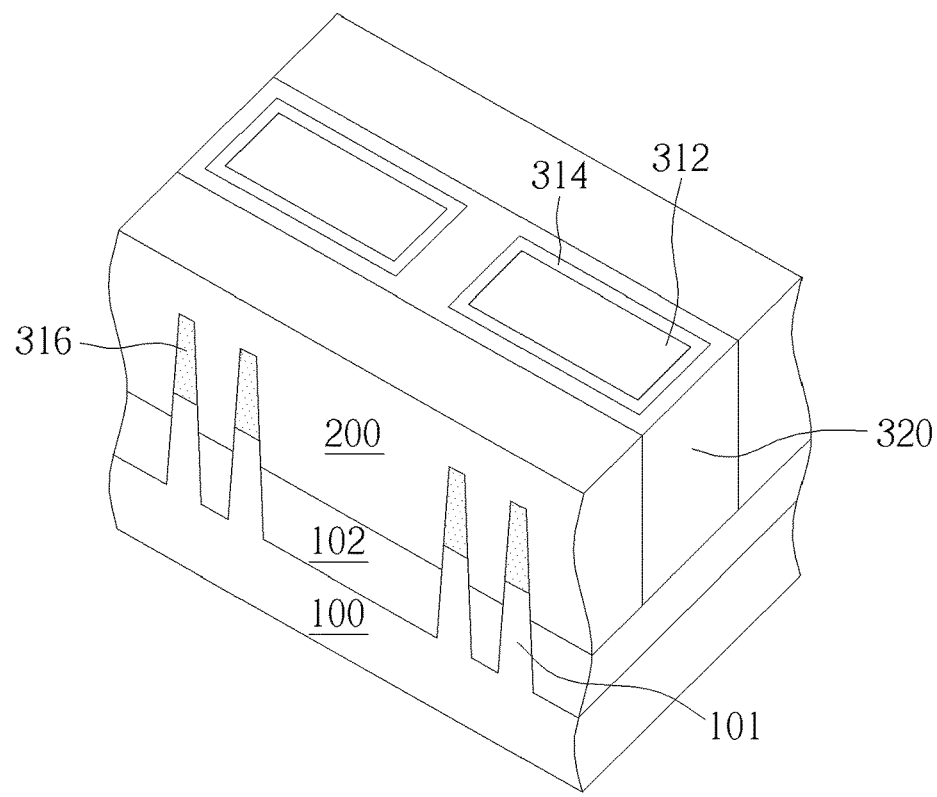

As shown in FIG. 5, two source/drain regions 316 are formed at two sides of each gate 300 in fin structure 101 respectively. The formation of the source/drain regions 316 may include performing an etching process and a selective epitaxial growth (SEG) process to form an epitaxial layer (not shown in the drawings) for example including silicon germanium, silicon germanium boron (siGeB), silicon carbide (SiC) or silicon carbide phosphate (SiCP) at two sides of each gate 300 in fin structures 101. Also, an in situ ion implantation process may be performed while performing the SEG process, to implant a proper dopant into the epitaxial layer to form the source/drain regions 316. However, in some embodiments, the ion implantation process may also be performed after the SEG process, or the ion implantation process may also be performed directly on the fin structures 101 instead of the epitaxial layer while the epitaxial layer may be omitted, to form the source/drain regions. Furthermore, in other embodiments, the SEG process may also be performed without firstly etching the fin structures 101, so as to form the epitaxial directly at two sides of the two gates, on the fin structures 101 to function like the source/drain regions.

It is noteworthy that, the source/drain regions 316 are disposed adjacent to the sacrificial spacer 320, so that, the sacrificial spacer 320 will not overlap with the source/drain regions 316, as shown in FIG. 5. In another embodiment, source/drain regions (not shown in the drawings) may also be formed after forming the spacer 314, with the source/drain regions adjacent to the spacer 314, followed by forming the sacrificial layer (not shown in the drawings) surrounded the two gate structures 300 at the same time. That is, the sacrificial spacer may partial overlap with the source/drain regions underneath.

Figure 7:
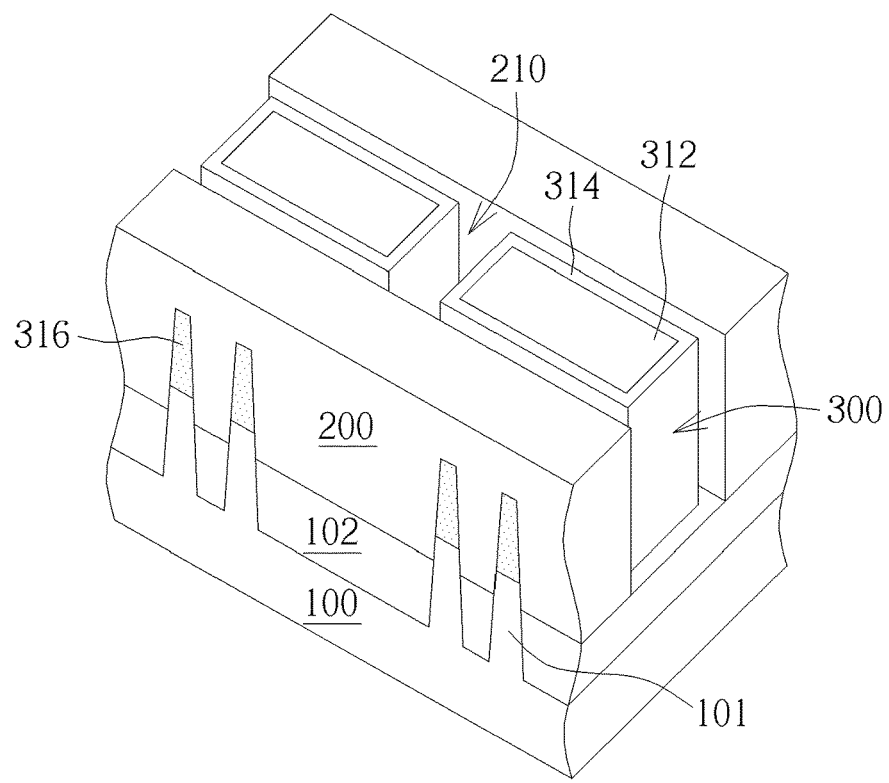

Following these, an interlayer dielectric (ILD) layer 200 for example including a dielectric material having etching selectivity related to the sacrificial spacer 320, like SiO, is formed on the substrate 100. The ILD layer 200 covers each fin structure 101 and the two gates 300, with a top surface of the ILD layer 200 being leveled with top surfaces of the two gates 300 and the sacrificial layer 320, and with a bottom surface of the ILD layer 200 directly contacting the substrate 100 and the top surface of the fin structures 101. Then, a replacement process is performed to form a spacing layer 318, thereto replace the sacrificial spacer 320. Precise speaking, after forming the ILD layer 200, an etching process is performed by using the etching selectivity between the ILD layer 200 and the sacrificial spacer 320, to completely remove the sacrificial spacer 320. Thus, an air-gap layer 210 is formed at the original position of the sacrificial spacer 320, to simultaneously surround the two gates 300, as shown in FIG. 7.

Figure 8:
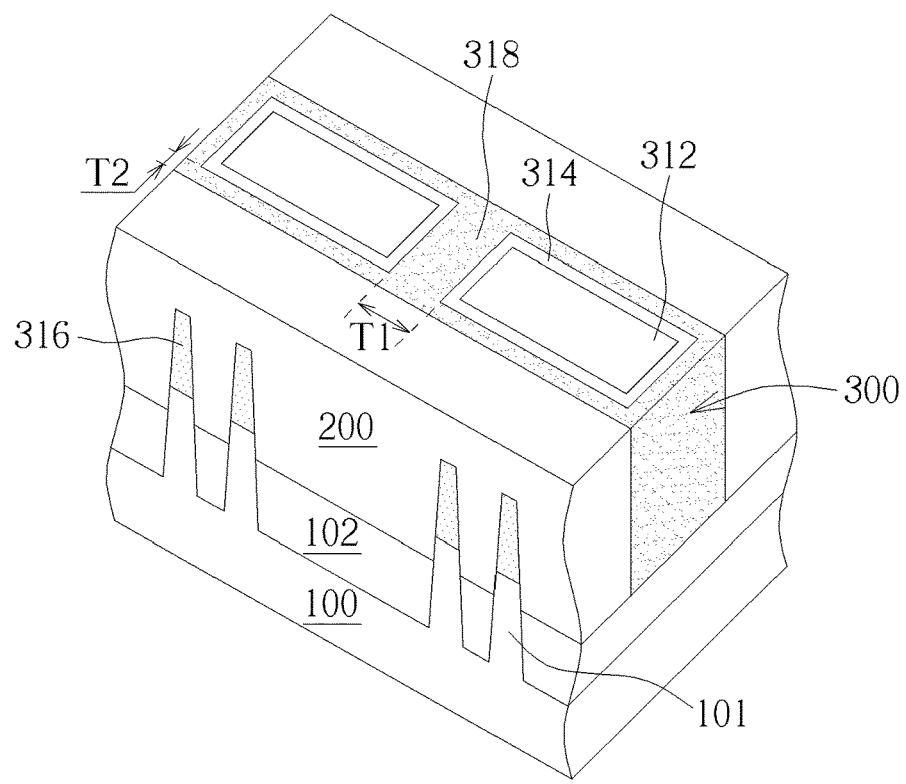

After that, the spacing layer 318 is formed to fill up the air-gap layer 210. The spacing layer 318 is namely formed at the position of the air-gap layer 210, so that, the spacing layer 318 is also allowable to simultaneously surround the two gates 300. Likewise, the spacing layer 318 covers entire sidewalls of each gate 300, including the two facing ends thereof, and pacing layer 318 further fills in the gap G between the two gates 300. Also, the spacing layer 318 filled in the gap G has a greater thickness T1, for example being about 3 times to 5 times greater than a thickness T2 of the spacing layer 318 in rest portions. Furthermore, the source/drain regions 316 are now adjacent to the spacing layer 318, as shown in FIG. 8. In the present embodiment, the spacing layer 318 preferably includes a dielectric material which may create a proper stress. For example, while each gate 300 is supported to form a P-type transistor, the spacing layer 318 may include a dielectric material to create compressive stress, such as compressive stress nitride. That is, the spacing layer 318 may therefore function like a compressive stress layer to create a compressive stress to the channel region of the P-type transistor. On the other hands, while each gate 300 is supported to form an N-type transistor, the spacing layer 318 may include a dielectric material to create tensile stress, such as tensile stress nitride. That is, the spacing layer 318 may therefore function like a tensile stress layer to create a tensile stress to the channel region of the N-type transistor.

Please note that, in the present embodiment, the previously sacrificial spacer 320 is used to define the predicted position of the spacing layer 318, and the spacing layer 318 is actually formed after forming the ILD layer 200. Through the aforementioned arrangement, the shape of the spacing layer 318 may not be affected by the etching back process, so as to obtain a complete appearance rather than an arched sidewall (not shown in the drawings) of general spacers like the spacer 314. For example, through a cross-sectional view along a direction perpendicular to the substrate 100, the spacing layer 318 is substantially in an I-shape, as shown in FIG. 8. Also, the spacing layer 318 may further cover on the arched sidewall of the spacer 314, to perform like an atypical I-shape with a bigger head and a smaller bottom for adjusting the structural defects of the spacer 314. On the other hands, the spacing layer 318 is formed on the spacer 314 directly, so that, the spacing layer 318 is closed to the channel region of each gates 300 to create proper stress. In some embodiment, the spacing layer 318 may also be formed through a simplified process, by directly forming the spacing layer 318 after forming the spacer 314 with a stress material. Otherwise, in another embodiment, the spacer 314 may also be removed while removing the sacrificial spacer 320, so as to form a spacing layer (not shown in the drawings) which is further closed to the channel region of the gates 300.

Thus, the forming process of a semiconductor device according to the first embodiment of the present invention is completed. In the following process, a replacement metal gate (RMG) process is performed to replace the gate dielectric layer 310 and the gate layer 312 by a high dielectric constant (high-k) dielectric layer (not shown in the drawings), a work function metal layer (not shown in the drawings) for example including Ta/TaN or Ti/TiN, and a metal gate layer (not shown in the drawings) for example including a low resistant metal like copper (Cu) or tungsten (W).

According to the forming process above, a sacrificial spacer 320 is previously formed after forming the two gates 300, to simultaneously surrounded the sidewalls of the two gates 300 and filled up the gap G between the two gates 300, thereto define the predicted position of the spacing layer 318 formed in the subsequent process. Then, after forming the ILD layer 200, the replacement process is performed to replace the sacrificial spacer 320 by the spacing layer 318, to ensure the complete appearance of the spacing layer 318. The spacing layer 318 preferably includes a stress dielectric material such as a processed nitride, so that, the spacing layer 318 may function like a compressive stress layer or a tensile stress layer for creating a proper compressive stress or a tensile stress to the channel underneath. In this way, the forming method of the present embodiment is able to form a semiconductor device with improved element performed.

However, people skilled in the arts may fully understand that the semiconductor device of the present invention may also be formed through other processes. The following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
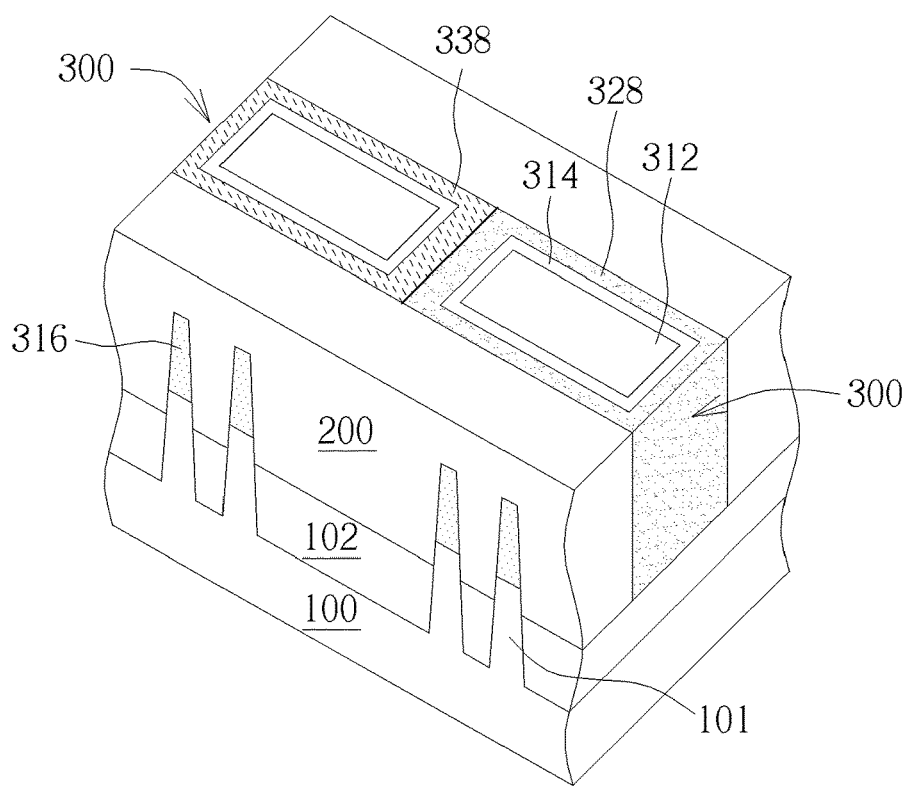
FIG. 9 is a schematic diagram illustrating a method of forming a semiconductor device according to a second embodiment of the present invention.

Please refer to FIG. 9, which are schematic diagrams illustrating a forming method of a semiconductor device according to the second embodiment of the present invention. The formal steps in the present embodiment are similar to those in the first embodiment as shown in FIGS. 1-6. The differences between the present embodiment and the aforementioned first embodiment are that, the spacing layer of the present embodiment includes two portions, including a first portion and a second portion of the spacing layer 328, 338 surrounded the two gates 300 respectively, and a side of the first portion and the second portion of the spacing layer 328, 338 are in contact with each other, as shown in FIG. 9.

Precisely, before removing the sacrificial spacer 320, a mask (not shown in the drawings) is previously formed to cover one of the two gates 300 and a portion of the sacrificial spacer 320, and then, the sacrificial spacer 320 surrounded the other one of the two gates 300 is removed, following by forming the spacing layer 328 to replace for the removed sacrificial spacer 320. Moreover, another mask (not shown in the drawings) is formed to remove the rest sacrificial spacer 320, following by forming the spacing layer 338 to replace for the rest sacrificial spacer 320. The spacing layer 328, 338 may include different dielectric materials in accordance with the conductive type of the two gates 300, therefore to both create a tensile stress, a compressive stress, or a tensile stress and a compressive stress respectively, but is not limited thereto. Through such performance, the two gates 300 of the present embodiment may be surrounded by two different spacing layers 328, 338 which include different dielectric materials and/or create different stresses. In this way, the channel regions of the two gates 300 are allowable to provide proper functions in accordance with the conductive types of the predicted formed transistors, for providing better and diverse element performance thereto.

Figure 10:
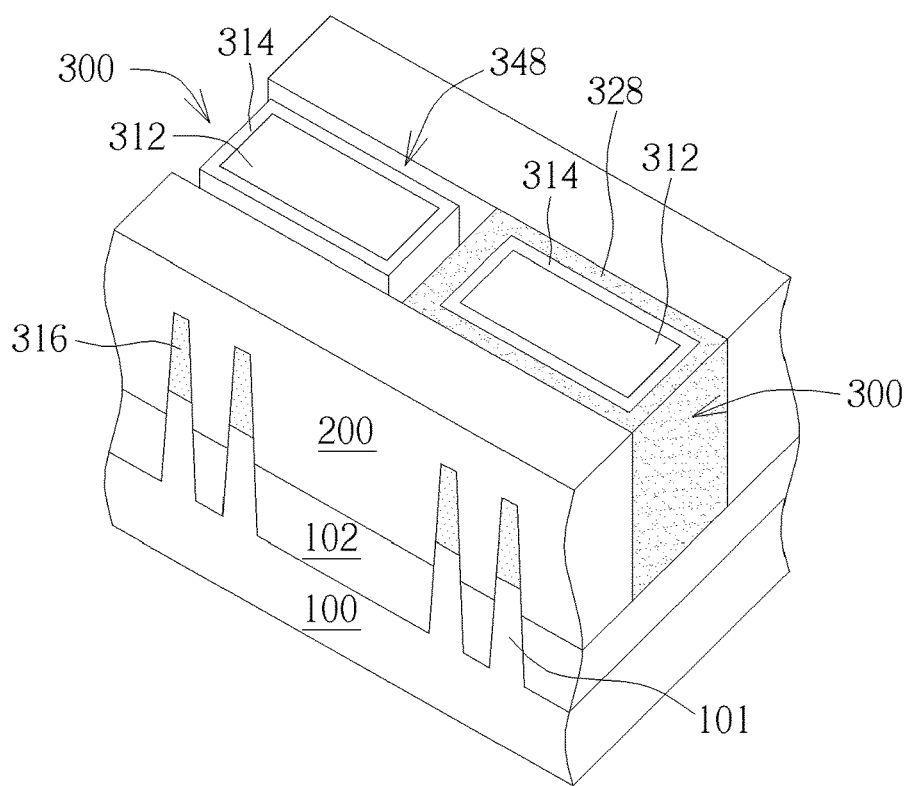
FIG. 10 is a schematic diagram illustrating a method of forming a semiconductor device according to a third embodiment of the present invention.

Please refer to FIG. 10, which are schematic diagrams illustrating a forming method of a semiconductor device according to the third embodiment of the present invention. The formal steps in the present embodiment are similar to those in the first embodiment as shown in FIGS. 1-6. The differences between the present embodiment and the aforementioned first embodiment are that, the spacing layer of the present embodiment also includes two portions, including the first portion of the spacing layer 328 surrounded one of the two gates 300 and an air-gap layer 348 surrounded the other gate 300, as shown in FIG. 10.

Precisely, before removing the sacrificial spacer 320, a mask (not shown in the drawings) is previously formed to cover one of the two gates 300 and a portion of the sacrificial spacer 320, and then, the sacrificial spacer 320 surrounded the other one of the two gates 300 is removed, following by forming the spacing layer 328 to replace for the removed sacrificial spacer 320. After removing the mask, the rest sacrificial layer 320 is removed, to form the air-gap layer 348, and a dielectric layer (not shown in the drawings) is further formed on the air-gap layer 348, covering the ILD layer 200, the air-gap layer 348 and the spacing layer 328. Through such performance, the two gates 300 of the present embodiment may be surrounded by the spacing layers 328 for creating a tensile stress or a compressive stress, and the air-gap layer 348 not creating any stress. In this way, the channel regions of the two gates 300 are also allowable to provide proper functions in accordance with the conductive types of the predicted formed transistors for providing better and diverse element performance thereto.

Figure 11:
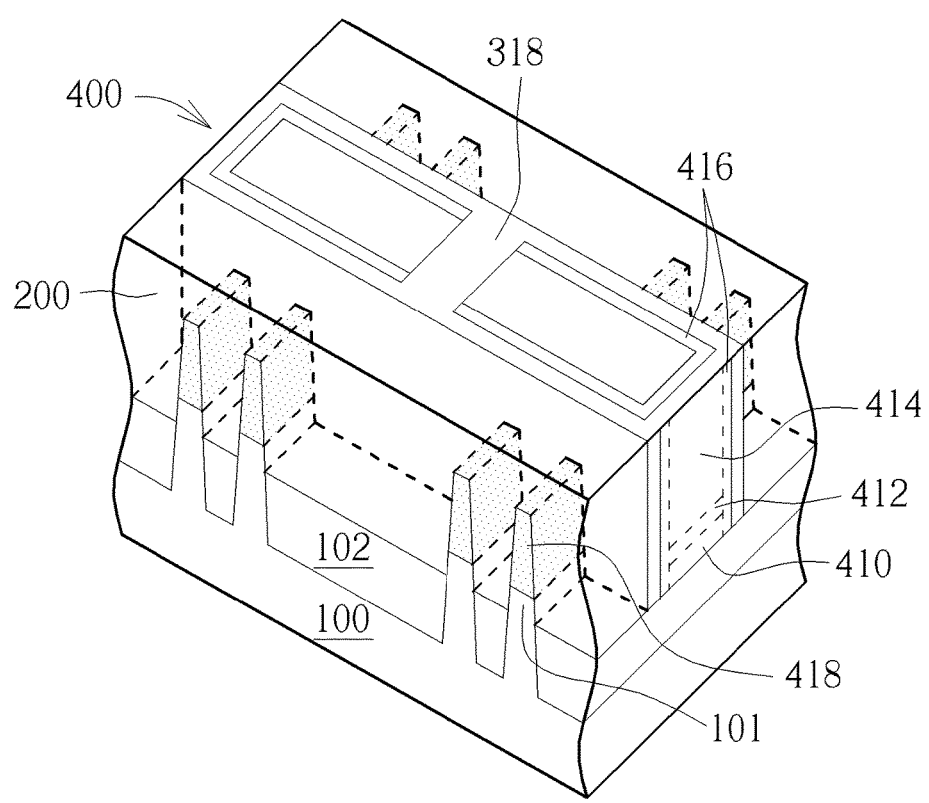
FIG. 11 is a schematic diagram illustrating a method of forming a semiconductor device according to a fourth embodiment of the present invention.

Please refer to FIG. 11, which are schematic diagrams illustrating a forming method of a semiconductor device according to the fourth embodiment of the present invention. In the present embodiment, metal gate 400 is formed directly with the metal gate 400 includes a high dielectric constant (high-k) dielectric layer 410, a barrier layer (not shown in the drawings), a work function metal layer 412 and a metal gate layer 414 stacked one over another, and a spacer 416 surrounded the high-k dielectric layer 410, the barrier layer, the work function metal layer 412 and the metal gate layer 414. Then, the metal gate 400 is patterned to form two separated portions, with each portion thereof across a portion of the fin structures 101 respectively.

Following these, a sacrificial spacer (not shown in the drawings) simultaneously surrounded the two portions of the metal gate 400, two source/drain regions at two sides of each portion of the metal gate 400, and a ILD layer 200 covered the substrate 100 are formed sequentially, and a replacement process is performed to replace the sacrificial spacer by a spacing layer 318, as shown in FIG. 11. In the present embodiment, the spacing layer 318 may also include a dielectric material which may create a proper stress, such as a compressive stress nitride or a tensile stress nitride. In this way, the spacing layer 318 may be function like a compressive stress layer or a tensile stress layer, so as to create proper stress to the channel regions below each portion of the metal gates 400, and the element performance of the semiconductor device in the present invention is sufficiently improved thereby. Furthermore, the spacing layer (not shown in the drawings) of the present embodiment may also be formed on top surfaces of the two portions of the metal gate 400, so that, the spacing layer may include a reverse U-shape along the direction perpendicular to the substrate 100. The aforementioned spacing layer is allowed to create a uniform stress to the channel region under each portion of the metal gate 400.

Additionally, people skilled in the arts may fully understand that although the formation of the spacing layers 318, 328, 338 in the aforementioned embodiments are exemplified by firstly forming a sacrificial layer and performing a replacement process to form the spacing layers 318, 328, 338, the forming method of the spacing layers in the present invention is not limited thereto. In another embodiment, the sacrificial may be omitted, and the formation of the spacing layer is accomplished by using a lithography and etching process to define predicted portion of each spacing layer 318, 328, 338 after forming the ILD layer 200, and then, performing a depositing process and an etching back process to form each spacing layer 318, 328, 338.

Overall speaking, the method of the present invention includes directly forming a spacing layer to simultaneously surround plural gates, with the spacing layer includes a dielectric material which may create a proper stress, such as a compressive stress nitride or a tensile stress nitride. In this way, the spacing layer may be function like a compressive stress layer or a tensile stress layer, so as to create proper stress the channel regions below each the gates.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a plurality of fin structures disposed on a substrate;
   two gates disposed on the substrate, across the fin structures, the two gates extended along a direction and disposed separately in the direction, the two gates both having a sidewall extended along the direction and a first end of one of the two gates facing a second end of another one of the two gates, wherein each of the two gates comprises a gate layer and a spacer surrounded the gate layer;
   a spacing layer disposed on the substrate, the spacing layer continuously extends along the direction to simultaneously surround the two sidewalls and the two spacers of the two gates and directly in contact with the first end and the second end of the two gates; and
   a dielectric layer disposed on the substrate, the dielectric layer surrounded the spacing layer.

2. The semiconductor device according to claim 1, wherein the dielectric layer and the spacing layer directly contact the fin structures and the substrate.

3. The semiconductor device according to claim 1, wherein a gap is disposed between the first end and the second end of the two gates, and the spacing layer fill up the gap.

4. The semiconductor device according to claim 3, wherein the gap has a width, and the width is greater than a thickness of the spacing layer disposed on the sidewalls of the two gates.

5. The semiconductor device according to claim 1, wherein each of the gates comprises two source/drain regions disposed at two sides of the gates in the fin structures.

6. The semiconductor device according to claim 5, wherein the source/drain regions are disposed adjacent to the spacing layer.

7. The semiconductor device according to claim 1, wherein the spacing layer comprises a first portion and a second portion surrounded the two gates respectively.

8. The semiconductor device according to claim 7, wherein the first portion comprises a stress nitride to create a tensile stress in an n-type transistor.

9. The semiconductor device according to claim 7, wherein the second portion comprises a stress nitride to create a compressive stress in a p-type transistor.

10. The semiconductor device according to claim 7, wherein the first portion comprises a stress nitride to create a tensile stress or a compressive stress to a transistor.

11. The semiconductor device according to claim 7, wherein the first portion comprises an air-gap layer.

12. The semiconductor device according to claim 7, wherein the first portion is in contact with the second portion.

13. A method of forming a semiconductor device, comprising:
    providing a substrate;
    forming a plurality of fin structures on the substrate;
    forming two gates across the fin structures, wherein the two gates extended along a direction and disposed separately on the direction, and a first end of one of the two gates facing a second end of another one of the two gates;
    forming a dielectric layer on the substrate, covering the two gates and the fin structures; and
    after forming the dielectric layer, forming a spacing layer on the substrate, the spacing layer simultaneously surrounded the two gates, and directly in contact with the first end and the second end of the two gates.

14. The method of forming the semiconductor device according to claim 13, wherein the forming of the two gates comprises:
    forming a gate dielectric layer and a gate layer on the substrate, across the fin structures;
    patterning the gate dielectric layer and the gate layer to form two stacked structures; and
    forming two spacers surrounded the two stacked structures respectively, to form the two gates.

15. The method of forming the semiconductor device according to claim 13, wherein, the forming of the spacing layer comprises:
    forming a sacrificial spacer surrounded the two gates;
    removing the sacrificial spacer to form an air-gap layer surrounded the two gates; and
    forming the spacing layer to fill in the air-gap layer.

16. The method of forming the semiconductor device according to claim 15, wherein the dielectric layer is formed after forming the sacrificial spacer.

17. The method of forming the semiconductor device according to claim 15, wherein the dielectric layer is formed before removing the sacrificial spacer.

18. The method of forming the semiconductor device according to claim 15, further comprising:
    forming two source/drain regions at two sides of the two gates in the fin structures, the two source/drain regions adjacent to the sacrificial spacer.

19. The method of forming the semiconductor device according to claim 18, wherein the forming of the two source/drain regions comprises:
    performing a selectively epitaxial growing process to form the two source/drain regions.

* * * * *